United States Patent [19]

Chang et al.

[11] Patent Number: 4,742,380
[45] Date of Patent: May 3, 1988

[54] SWITCH UTILIZING SOLID-STATE RELAY

[75] Inventors: Gee-Kung Chang; Adrian R. Hartman; Harry T. Weston, all of New Providence, N.J.

[73] Assignee: American Telephone and Telegraph Company, AT&T Bell Laboratories, Murray Hill, N.J.

[21] Appl. No.: 9,635

[22] Filed: Jan. 23, 1987

Related U.S. Application Data

[63] Continuation of Ser. No. 646,708, Aug. 31, 1984, abandoned, which is a continuation-in-part of Ser. No. 347,094, Feb. 9, 1982, abandoned.

[51] Int. Cl.[4] .............................................. H01L 29/78
[52] U.S. Cl. ................................... 357/23.4; 357/22; 357/23.8; 357/23.14; 357/30; 357/39; 357/53; 357/86; 357/43; 307/311; 307/646
[58] Field of Search ................. 357/38, 39, 43, 86, 357/53, 22, 23.4, 23.8, 23.14, 30; 307/311, 252 T, 646

[56] References Cited

U.S. PATENT DOCUMENTS

| | | | |
|---|---|---|---|
| 3,938,176 | 2/1976 | Sloan | 357/49 |
| 4,001,860 | 1/1977 | Cauge et al. | 357/23 |
| 4,199,774 | 4/1980 | Plummer | 357/41 |
| 4,331,884 | 5/1982 | Svedbers | 357/23.4 |
| 4,414,560 | 11/1983 | Lidow | 357/23.4 |

OTHER PUBLICATIONS

*International Electron Devices Meeting Technical Digest*, Dec. 1980, "A FET-Controlled Thyristor in SIPMOS Technology", pp. 79-82.

J. Ti Hanyi, *International Electron Devices Mtg. Tech. Digest*, Dec. 1980, "Functional Integration of Power MOS and Bipolar Devices", pp. 75-78.

*ISSCC*, Feb. 1978, "A MOS-Controlled Triac Device", pp. 222-223.

*IEEE Transactions on Electron Devices*, vol. ED27, No. 2, Feb. 1980, "Insulated-Gate Planar Thyristors", pp. 380-394.

*Primary Examiner*—Joseph E. Clawson, Jr.
*Attorney, Agent, or Firm*—David I. Caplan

[57] ABSTRACT

A solid-state relay is combined with a control circuit to form a switch which is bilateral and linear through the origin, can withstand large current or voltage surges, and can be toggled either electrically or optically. The relay portion comprises either a pair of or two subsets of DMOS transistors, and the pair of transistors or selected ones of each subset cooperate to form a pair of oppositely poled thyristors. The control circuit provides well regulated turn-on and turn-off of the relay and provides good immunity against high voltage transients on the switch's main terminals. The control circuit also serves to limit the maximum voltage that is applied to the gate oxides of the transistors.

23 Claims, 4 Drawing Sheets

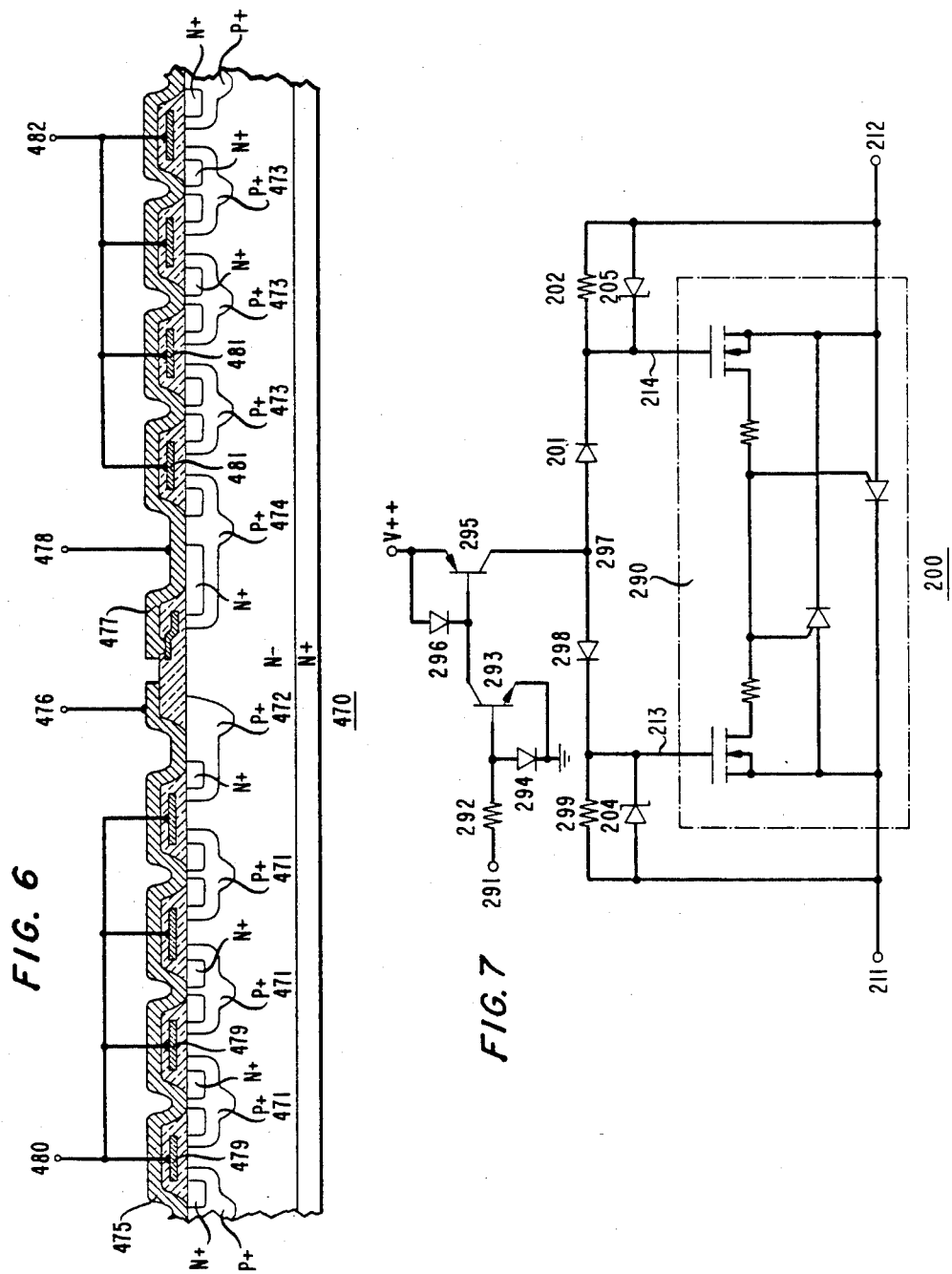

SWITCH UTILIZING SOLID-STATE RELAY

CROSS-REFERENCE TO RELATED APPLICATION

This application is a continuation of application Ser. No. 646,708, filed Aug. 31, 1984, now abandoned, which is a continuation-in-part of application Ser. No. 374,014, filed Feb. 9, 1982, now abandoned.

TECHNICAL FIELD

This invention relates to a solid-state switch and, more particularly, to a switch which is normally off, linear through the origin, and able to withstand current and voltage surges safely.

BACKGROUND OF THE INVENTION

In telecommunications there is a growing need for an inexpensive switch of the properties mentioned and that is able to withstand high voltages of either polarity in the OFF state. It would be particularly advantageous if the switching could be easily controlled either by the photovoltaic voltage of a photosensitive element or by an electrical logic signal.

Important in achieving a switch of this kind would be a solid-state relay having a low resistance in the ON state to currents flowing in either direction, a high resistance in the OFF state in either direction even to high voltages, the capability of being switched between these states with a relatively low control voltage, and the ability to withstand surges of high voltage and current with no damage.

A device that meets some of these characteristics has been described in a U.S. Pat. No. 4,199,774 which was issued on Apr. 22, 1980, to J. D. Plummer. This device involves the merger, in a semiconductive body essentially on a single top surface, of a pair of MOS lateral transistors, of a form known as DMOS, and an NPNPN triac. This device is further described in a pair of papers in the *IEEE Transactions on Electron Devices,* Vol. ED27, No. 2, February 1980, pp. 380-394, entitled "Insulated-Gate Planar Thyristors."

A DMOS transistors is so called because it was originally made by a double-diffusion process. A distinctive characteristic of such a transistor is that the source region is included within a closely surrounding layer, which will be termed the shielding layer, of the opposite type, a portion of which lies adjacent the surface and underlies the gate electrode, whereby it can be inverted to serve as the channel of the transistor. The source and shielding layer in turn are enclosed in a bulk portion which is of the conductivity type of the source and serves as the drain.

In the Plummer device, the five layers of the NPNPN triac are formed in turn by the source and shielding layer of the first transistor, the common drain of the two transistors, and the shielding layer and source of the second transistor. The basic structure includes three terminals, a connection common to the gates of the two transistors, a connection common to the source and shielding layer of the first transistor and a connection common to the source and shielding layer of the second transistor. The two last-mentioned connections serve to define the main conduction path whose resistance is controlled by voltages applied to the first-mentioned connection.

We have found that this prior art device has limitations which reduce its attractiveness.

Such a device is designed to function as a series pair of MOS transistors at low operating voltages and currents and as a bidirectional thyristor switch at higher voltages and operating currents. However, in practice in this relatively simple structure, it is difficult to control its various parameters so that there can readily be achieved a device with a desired set of operating characteristics.

Additionally, it is characteristic of this device that for reliability it is important that the gate oxides of the two transistors be rugged enough to withstand, without damage, essentially the full voltage applied between the two main terminals. For applications in which this voltage is apt to be high, for example hundreds of volts, this imposes stringent requirements on the gate oxide and leads to thicknesses that make it difficult to switch with low voltages.

Additionally, with this structure, the current flow through the device is largely only the lateral flow adjacent the top surface of the semiconductive body in which it is formed. Because of the limited volume available for current flow, the ON resistance tends to be higher than would be the case if more of the volume of the body could be used for current flow through the device when it is ON.

In pages 75 through 78 of the *International Electron Devices Meeting Technical Digest,* Dec. 8-10, 1980, there is a paper by J. Tihanyi entitled "Functional Integration of Power MOS and Bipolar Devices," wherein there are described a number of devices including vertical MOSFET-triggered thyristors, optically coupled lateral thyristors with MOS input, and optically coupled lateral MOS triacs. However, Tihanyi's thyristor and triac devices are designed primarily for use as MOS controlled thyristors and triacs and are not designed to be used simply in a transistor linear mode.

Moreover, Tihanyi does not provide control circuits for alleviating the requirements on the gate oxides in the transistor controls.

SUMMARY OF THE INVENTION

A switch in accordance with our invention utilizes a novel solid-state relay portion cooperating with a novel auxiliary circuit portion.

Our switch comprises a silicon body which includes a plurality of serially connected pairs of DMOS transistors sharing a common drain and in the ordinary mode of operation of the switch, these operate as transistors. Additionally, in response to high voltages and currents capable of damaging the transistors, a subset of transistor pairs effectively shift to operate as thyristors, thereby better to protect the tolerance of the switch to the high voltages.

Firstly, in its preferred form our invention utilizes an array of vertical DMOS transistors divided into two subarrays to keep low the series resistance of the relay when it is operating simply in the transistor mode. Secondly, our invention utilizes the fact that a five layer triac is the quivalent of a parallel arrangement of two oppositely poled four-layer unilateral thyristors, and so utilizes an array of unilateral thyristors which are partially unmerged from the transistors so that they may be of a design that optimizes their unilateral properties and permits better control of the onset of the switching characteristic. Additionally, in its preferred form our invention includes a novel control circuit that complements the novel relay to permit close control of the operating characteristics of the switch while maintaining modest the requirements on the gate oxide of the device even when high operating voltages are employed.

A common characteristic of a relay in accordance with our invention is that it comprises a silicon body which includes a pair of DMOS transistor subsets; each transistor of the subset is a vertical transistor having a separate source region, shielding region, and channel region which is overlain with a gate electrode; and all transistors share the bulk of the body as a common drain region. Additionally, the relay utilizes a subset of transistor pairs which cooperate to form an array of unilateral, four-layer lateral thyristors, each of the thyristors being of a design that permits easy control of its parameters. When bilateral protection is desired, the array of thyristors includes two separate subsets whose thyristors are oppositely poled, and each subset includes alternate ones of the array.

Additionally, the novel control circuit utilizes voltage-controlled variable resistors, such as junction field-effect transistors, between the sources and gates of the DMOS transistors, to provide high resistance, during turn-on and in the ON state, to block shunt paths for the control currents; and to serve as low resistance paths during turn-off improve the switching speed of the switch; and in the OFF state to provide immunity to momentary false turn ON by fast transients on the switch's main terminals. The circuit also includes zener diodes to serve as clamps between the sources and gates of the transistors to limit the voltage difference that can develop thereacross.

BRIEF DESCRIPTION OF THE DRAWING

Each of FIGS. 1, 2 and 7 is a circuit schematic of a switch in accordance with the invention, and Each of FIGS. 3, 4, 5 and 6 is a sectional view of the structure of solid-state relays for use in the switches of FIGS. 1, 2 and 7.

DETAILED DESCRIPTION

Figure 1:
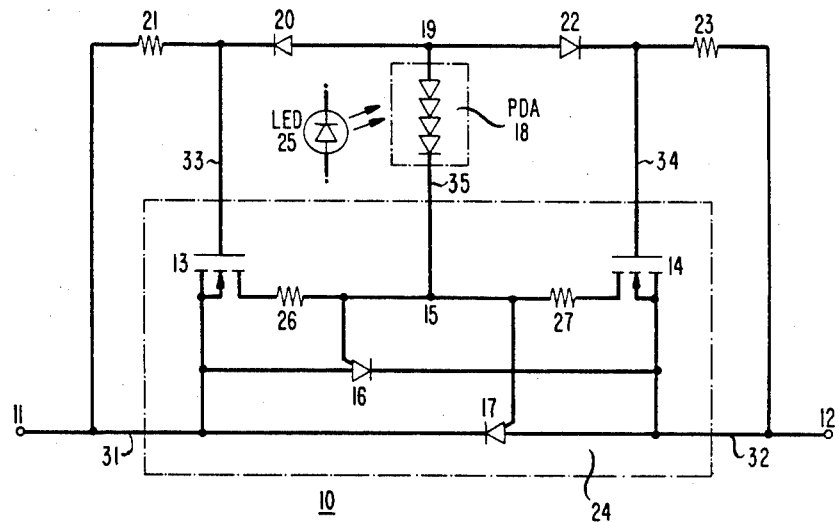

With reference now to the drawing, the switch 10 shown in circuit schematic form in FIG. 1 includes main current-handling or external terminals 11 and 12, the resistance between which is to be varied from a high value, typically at least a megohm, to a low value, typically less than a hundred ohms, in accordance with control signals.

Enhancement type transistors 13,14, advantageously of DMOS N-type, are connected to have their channels in series between terminals 11 and 12. The "source" of transistor 13 is connected to terminal 11, the "source" of transistor 14 is connected to terminal 12 and their "drains" are connected together to form internal node 15. Accordingly, this arrangement will be referred to as a series pair of oppositely poled DMOS transistors. It should be noted that as used herein the term "drain" is used to describe the region which forms the bulk of the transistor as opposed to the localized region (the "source") which is enclosed within the shielding layer and shares a common electrode with the shielding layer. In actual operation, depending on the polarity of the applied voltage, this bulk region may serve either as the functional source supplying the majority carriers flowing through the channel or as the functional drain collecting such majority carriers. PNPN thyristors 16 and 17 are also connected, in antiparallel, i.e., oppositely poled relation, between terminals 11 and 12 and each has its anode-gate connected to the internal node 15.

A photosensitive element 18, which typically is a photodiode array, is connected between node 15 and external control node 19. Blocking diode 20 and resistor 21 are serially connected between node 19 and terminal 11. Similar blocking diode 22 and resistor 23 are serially connected between node 19 and terminal 12. The resistors 21 and 23 typically need to have large resistance values and advantageously can be pinch resistors having a low saturation current. The gates of transistors 13 and 14 are connected to the nodes between diode 20 and resistor 21, and diode 22 and resistor 23, respectively.

Typically, in the merged device, there will be resistance between the gates of the thyristors and the drains of the DMOS transistors and this has been indicated by the resistors 26 and 27. The size of such parasitic resistors affects the current at which the thyristors latch to a conducting or ON condition.

In operation, a voltage is applied between the external terminals 11 and 12, but in the absence of radiation incident on photosensitive element 18, insignificant current flows because each of the paths between terminals 11 and 12 includes high resistance, either in the form of the reverse biased diode stack of photosensitive element 18, one of the blocking diodes 20,22, the OFF transistors 13,14 or the OFF thyristors 16,17. Each of the transistors is off because the gate-source voltage on each transistor is below the threshold for formation of the conductive channel in the transistor. This gate-source voltage is below threshold because the resistors 21 and 23 hold the gate potentials very close to those of terminals 11 and 12, respectively. Each of the thyristors is off because the absence of significant current flow through node 15 permits essentially no current to flow to their gates. Moreover, because diodes 20 and 22 are oppositely poled, one of the two will be oppositely poled or in a high resistance state for either polarity of the voltage between terminals 11 and 12. Likewise, the series connected diodes of photosensitive element 18 are poled so as to offer high resistance for either polarity of voltage between terminals 11 and 12.

Photosensitive element 18 is optically coupled to a suitable light source 25, typically a light-emitting diode, to which are applied the switching control signals. When sufficient radiation is made incident on the photosensitive element 18, it serves to provide current to charge the gate capacitances and as a supply of gate-source biasing voltage for each of the transistors. To this end, the polarities of each of diodes 20 and 22 relative to the photovoltaic voltage developed are such as to pass readily the photovoltaic currents which flow, and these charge the gate-source capacitances of each transistor appropriately for creating the inversion layers which turn the transistors on. In an illustrative embodiment, the photodiode array 18 is designed to generate a voltage, typically of about 15 volts, at the control node 19 for turning on transistors 13 and 14. With transistors 13 and 14 each turned on to a low resistance, voltages maintained between terminals 11 and 12 will cause current flow therebetween whose magnitude is related essentially linearly to that of the voltage maintained, independently of the polarity of the applied voltage.

The OFF state can be reestablished by extinguishing the light illuminating the photosensitive element, thereby rendering it an open circuit. In this case the charge stored on the gate capacitors of the transistors is discharged via the resistors 21,23 to the terminals 11,12, the gate potentials approach the terminal potentials, and the transistors stop conducting when the inversion layer disappears.

Thyristors 16 and 17 are so designed that, as long as normal currents are flowing, the voltage at node 15 is insufficient to trigger either of them to its ON state, so that these are dormant. However, these thyristors are further designed to be turned on if the current flow past node 15 rises beyond a design limit. Such abnormal flow raises the voltage difference between node 15 and the terminals 11 and 12 sufficiently that the resultant voltage on the gate of the appropriate one of thyristors 16,17, depending on the polarity of the voltage between terminals 11,12, is sufficient to turn it on. In this ON state it serves to divert current from the transistors and to minimize the likelihood of damage from excess current flow therethrough. The thyristors 16,17 are further designed so that with the cessation of abnormal current flow past node 15 and its return to normal levels, the current available at the anode of the ON thyristor is insufficient to maintain it in this state and it reverts to its OFF state.

It is an advantage of the circuit depicted that at least the elements within the broken line 24, comprising the two transistors and the two thyristors, can be provided by a single component which merges these various elements. It will be convenient to describe this component as a "solid-state relay" and to describe this portion of the switch as the relay portion. The remainder of the switch is considered to be the auxiliary control portion and it includes a powering portion including primarily the photodiode array 18 and the distribution portion including the diodes 20,22 and resistors 21,23, and associated conductors providing the five leads 31–35 for connection to the five electrodes of the solid-state relay portion.

The solid-state relay portion is particularly well adapted for merger into a single structure because of the common connection of the drains of the two transistors and the gates of the two thyristors. This permits a single zone or region of uniform conductivity type of a semiconductive body to serve each of these roles in a merged structure.

A variety of solid-state relays can be combined with our control circuits used in the practice of the invention. For example, any of the solid-state relays described in this application may be used. Alternatively, relays of the kind described in the Plummer patent, modified to include five terminals, may be used. Additionally, there may be used solid-state relays of the kind described in a paper entitled "Optically Coupled Power Mosfet Technology: A Monolithic Replacement for Electromechanical Relays" by E. T. Rodriguez, published in the *Professional Program Session Record of Electro/83: Power MOSFETS—The Second Generation*, on Apr. 19–21, 1983, New York, N.Y. However, in the preferred embodiments of the invention, the solid-state relay will be of the kinds known in FIGS. 3–6.

Figure 2:
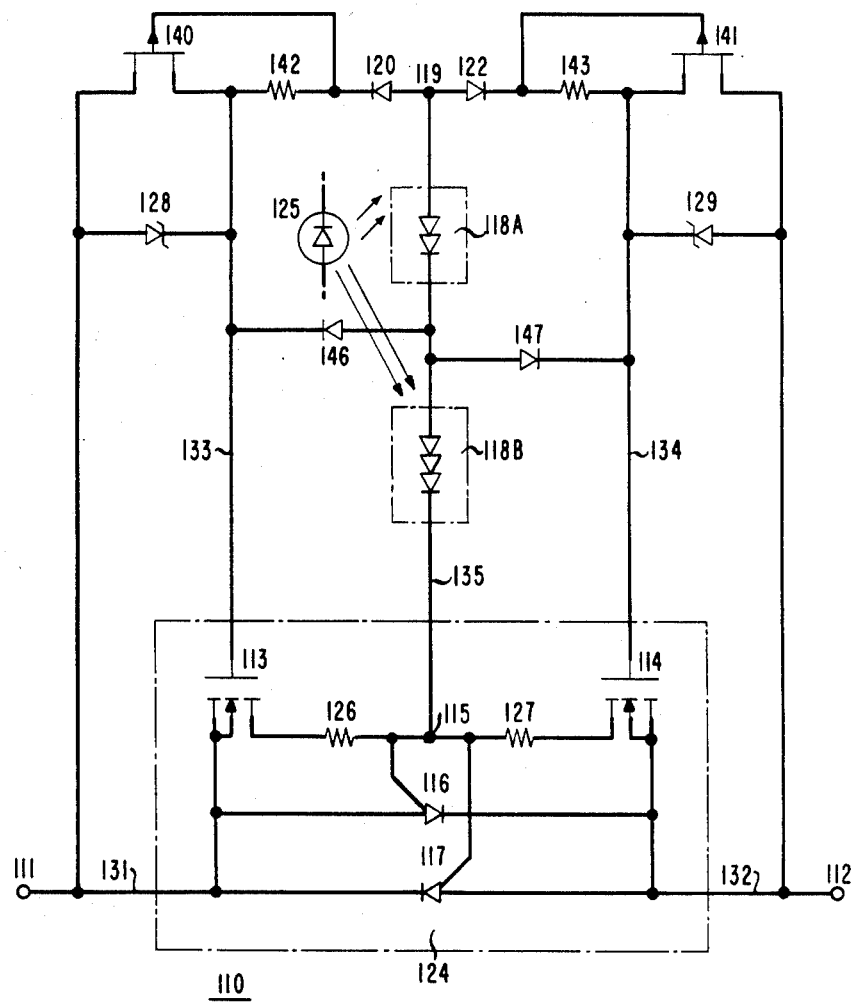

FIG. 2 shows a switch 110 which includes an improved form of control circuit which permits faster operation. The elements of this switch, which correspond to those in the switch of FIG. 1, have a specific numeral which is higher by 100. The principal modifications include the substitution of P-type JFET transistors 140 and 141 for resistors 21 and 23, the inclusion of resistors 142 and 143 in series with the channels of transistors 140 and 141 between the transistors and diodes 120 and 122, respectively, the division of the photodiode array into two sections 118A and 118B, and the inclusion of diodes 146 and 147, between the node between sections 118A and 118B and the gates of DMOS transistors 113 and 114, respectively. Moreover, the gates of transistors 140 and 141 are connected to the nodes between resistor 142 and diode 120 and between resistor 143 and diode 122, respectively. LED 125 is arranged to illuminate each of the sections 118A and 118B, when energized.

Various advantages result from the modifications of this improved control circuit.

In the switch shown in FIG. 1 when the photodiode array 18 is illuminated by energizing the LED 25 to turn the switch ON, not all of the photocurrent generated is available to charge the gates of the transistors, and instead some of it is lost in the current path including fixed resistors 21 and 23 even though these resistors are advantageously of high resistance. These resistors are important for efficient turn OFF to provide a discharge path for the gates of the transistors 13,14 when the LED 25 is extinguished to turn the switch OFF. This loss disadvantageously requires a larger photodiode current than might otherwise be necessary.

Another disadvantage of resistors 21 and 23 is that they serve to isolate the gates of each transistor from its source and body which is undesirable in the OFF state because it makes the switch more susceptible to momentary turn ON by fast transients in the main current path.

These disadvantages are avoided by the substitution for fixed resistors 21 and 23 of JFETs 140 and 141, respectively. Such devices can have high resistance during turn ON and in the ON state, but low resistance during turn OFF and in OFF state, since they are effectively voltage-controlled resistors. The ON state corresponds to the state of the switch when the normally available JFET channel has been closed by the spreading of the depletion layer associated with the JFET's PN junction. The OFF state is the opposite state of the switch when the JFET channel is present. Each JFET 140,141 is of the P-type channel kind so that it offers a high resistance when its gate is at a positive potential sufficient to block the channel, a potential which can be provided by the photodiode array.

With such substitution when the photodiode array comprising sections 118A and 118B is illuminated by turning ON the LED 125, ignoring for the moment the paths including diodes 146 and 147 which are optional, the current generated by the photodiode array, typically several microamperes, flows to several different sinks. First, portions flows through resistors 142 and 143 to the gates of the DMOS transistors 113 and 114 of the relay. Also portions flow through these resistors and the normally on JFETs 140 and 141 to the terminals 111 and 112. Finally, portions flow to the gates of JFETs 140 and 141. After a short time, typically several microseconds, the gates of the JFETs charge enough to pinch OFF the current flow through each JFET and each JFET turns OFF and has a high differential resistance, allowing only the very small leakage saturation current to be lost to terminals 111 and 112. As a result, most of the photocurrent generated becomes available to charge the gates of the DMOS transistors of the relay.

However, to charge the gates of the DMOS transistors, this photocurrent still needs to traverse resistors 142 and 143 and the time constant associated with the DMOS turn ON can be relatively slow. Resistors 142 and 143 desirably are large enough to ensure that the potential of the gate of each JFET rises higher than that of its corresponding source and fast enough so that the JFET can turn OFF quickly, although not so large as to slow down severely the turn ON time of DMOS transistors 113 and 114 of the relay.

It will be characteristic of this switch that the turn OFF time is normally shorter than the turn ON time. Therefore, appropriate combinations of such switches may be used in applications requiring a break-before-make switching operation. For example, a pair of such switches may be used and each supplied with one of a pair of complementary control input signals so that at most only one switch is ever closed even during the switching operation, since the first switch is closed only after the second switch is opened.

It should also be noted that in the OFF state, the switch shows improved immunity to momentary turn-on by fast transients on its main terminals. This is because the normally ON JFETs will provide a relatively low resistance (typically several hundred ohms) between the source and gate of each DMOS transistor of the relay. This enables the gate potential to follow that of the source so that false turn ON from transients is inhibited.

There may be applications for which especially fast turning ON is desirable and this is accomplished by the inclusion of diodes 146 and 147 connected to a tap, in the interior of the photodiode array, dividing it into sections 118A and 118B as depicted. The top portion 118A is designed to provide a voltage adequate for charging the gates of the JFETs 140,141 and the bottom portion 118B is designed to provide a voltage for charging the gates of the DMOS transistors 113 and 114 of the relay. The diodes 146 and 147 are included for reverse blocking when the photodiode array is OFF.

This arrangement is designed so that the photocurrent flows first largely to the side of the circuit at lower potential; then after the side turns on and the voltage on the switch drops, the photocurrent flows to the more positive side of the circuit to establish the linear voltage-current ON state.

When the photodiode 125 is illuminated to turn the switch ON, the photocurrent generated by array portion 118A flows to the gates of the JFETs 140 and 141 to quickly pinch OFF their channels. With the JFETs nonconducting, all of the current generated by the array portion 118B is available to charge the gates of the DMOS transistors 113 and 114 without passing through any large resistance, thereby permitting rapid turn ON. Moreover, once the JFETs are OFF, the photocurrent generated by portion 118A also is available for charging the gates of the DMOS transistors.

When the photodiode array is unilluminated and the switch is OFF, typical voltages at particular nodes of the switch might be as follows when terminal 111 is at ground and terminal 112 is at 100 volts: The gate of DMOS transistor 113 is also at ground; that of DMOS transistor 114 is at 100 volts; terminal 115 is at 99 volts; and node 119 at 1 volt. When the photodiode is illuminated so that node 119 is at 16 volts, the tap at 11 volts and the terminal 115 at 1 volt, and the switch is turned ON, the voltage at terminal 112 would drop to 2 volts, and the voltage on the gates of the JFETs would be about 15 volts, and that on the gates of the DMOS transistors would be about 13 volts.

A further optional modification of the switch of FIG. 2, as compared to that of FIG. 1, is the addition of zener diodes 128 and 129 to prevent the voltage on the gates of the DMOS transistors from going much higher than that on the source and body of the DMOS transistors, thereby further protecting the thin gate oxide region of the DMOS transistors from voltage overstress. Typically, the diodes are chosen to break down at about twenty volts to fix the maximum voltage difference to such value.

Figure 3:
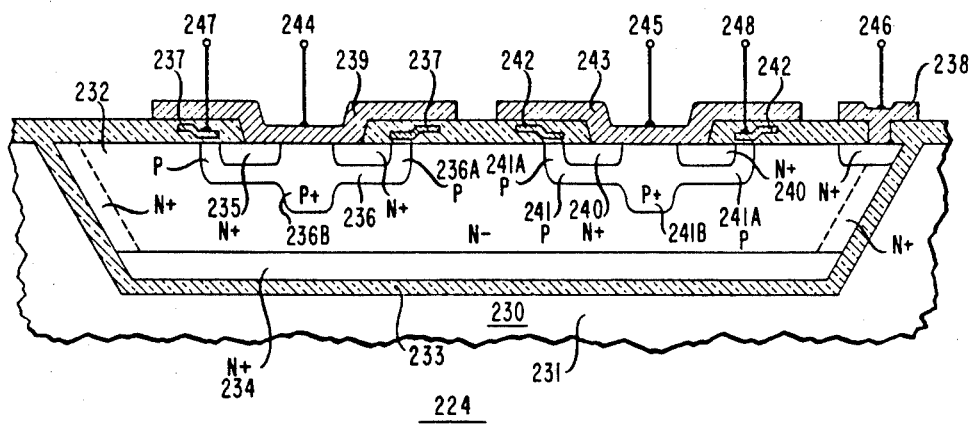

FIG. 3 shows the solid-state relay portion 224 formed in a monocrystalline silicon tub in a chip 230, the main portion 231 of which is polycrystalline silicon and which would normally house a plurality of such tubs each dielectrically isolated from one another in the manner known to workers in the art. In particular, the figure shows only one silicon tub, the bulk 232 of which is relatively high resistivity N-type (shown as N—), typically with a doping of about or less than $10^{15}$ per cubic centimeter, and which is dielectrically isolated from the polycrystalline bulk 231 by the silicon oxide layer 233. A relatively lower resistivity N-type skin layer 234 (shown as N+) is included in the bottom surface of the tub at its interface with the oxide layer 233. Often it will be advantageous to extend the layer 234 to include the sidewalls of the tub as shown by the broken line. The average doping concentrations in the regions 232 and 234 differ by at least a factor of ten, and advantageously more.

At its top surface, the tub includes the left and right enhancement-mode N-type vertical DMOS transistors. The left transistor comprises the annular N-type source 235 which is surrounded by a P-type shield region 236 whose outer lightly doped surface portion 236A serves as a channel. The surface portion 236A underlies the annular oxide-insulated gate electrode 237 which, when appropriately biased, acts to invert the surface portions for creation of the channel in the manner characteristic of MOS transistor operation. The N-type bulk 232, together with the skin layer 234, serves as the drain of the transistor. To this end, electrode 238 makes an ohmic connection to the bulk at one edge. Since, in this structure, electrode 238 needs conduct only small currents, essentially only the photocurrents generated by the photodiode array, it can tolerate resistance in its connection to the layer 234, whose major role is to provide a low resistance path for the current flowing internally between the transistors. Electrode 239 serves as the source electrode for the left transistor and to this end makes low resistance connection to the source 235. It also makes low resistance connection to the more highly doped (P+) passive central portion 236B of shield region 236. Advantageously, the central portion extends more deeply into the bulk 232 than the annular edge portion. Since much of the shield layer serves the same role as the substrate portion in a conventional MOS transistor, it is maintained at the same potential of the source in accordance with the usual practice of biasing a MOS transistor. It is advantageous to increase the doping in the central region 236B of the shield layer contacted by the electrode 239 to keep the shunting resistance low between regions 236A and 235. Electrode 239 advantageously overlies the gate electrode 237 to serve as a field plate, but is spaced sufficiently therefrom to ensure isolation.

The right transistor spaced apart on the same surface comprises the annular N-type source 240 which is included within the P-type shield region 241, outer lightly-doped surface portion 241A of which serves as the transistor channel in the manner of 236A. This portion is overlaid with the annular oxide-insulated gate electrode 242. The N-type bulk 232 and skin layer 234 also serve as the drain of this transistor and share with the other transistor the drain electrode 238. An electrode 243 makes low resistance connection both to the source 240 and to the passive more heavily doped central region 241B of shield region 241 and overlaps gate electrode 242 in the fashion of electrode 239.

It can be appreciated that in some instances it may be desirable to segment each of source 235 and source 240 into a plurality of segments, and similarly the gate electrodes 237 and 242, effectively to divide each transistor into two or more transistors, sharing a common drain, which can be connected in parallel. This is well known for high power MOSFETs and special variations will be discussed further below. In operation, assuming that electrode 239 is at the more positive voltage, when the switch is in an ON state, the main current flows between the two electrodes 239 and 243, not only by way of the top surface of the bulk but significantly also from the left transistor vertically downwards through the bulk to the heavily doped skin, laterally through the skin and then upwardly through the bulk to the right transistor.

For this polarity, region 240 serves as the functional source and the bulk as the functional drain of the right transistor while the bulk serves as the functional source and the region 235 as the functional drain of the left transistor. The roles would be reversed for the opposite polarity.

The positions of the various zones in the tub are such as to create a parallel pair of oppositely poled thyristors between the electrodes 239 and 243. In particular, the right-most portion of zone 235 together with the right-most portion of zone 236, the bulk 232, and the left-most portion of zone 241 form an NPNP thyristor of which the N-type bulk 232 serves as the gate and the electrode 238 the gate electrode. In addition, the left-most portion of zone 240, the left-most portion of zone 241, the bulk 232 and the right-most portion of zone 236 form a second oppositely poled NPNP thyristor of which the N-type bulk 232 serves as the gate and the electrode 238 the gate electrode. Alternatively, zone 235, zone 236, bulk 232, zone 241 and zone 240 may be viewed as forming a single five-layer NPNPN triac between electrodes 239 and 243, of which the bulk 232 and skin layer 234 is the gate. The value of resistors 26 and 27 shown in FIG. 1 will be determined by the properties and dimensions of the bulk 232 and skin layer 234 and are chosen to help realize a desired latching current for the thyristors.

Comparing the structure of FIG. 3 with the circuit shown in FIG. 1, it is seen that leads 31 and 32 correspond to leads 244 and 245 which connect to electrodes 239 and 243, respectively; leads 33 and 34 to leads 247 and 248 which connect to electrodes 237 and 242, respectively; and lead 35 to lead 246 which connects to electrode 238.

Accordingly, leads 244,245 of FIG. 3 are the leads connected to the main terminals 11,12 of FIG. 1 between which the large load currents flow. The other leads handle only small control currents but do encounter the high voltages that may appear between the main terminals. However, each of the gate electrodes is maintained at a voltage which is relatively close to the voltage of its source/shield electrode so that the gate-source/shield voltage difference, which is the critical factor for damaging the gate dielectric, remains relatively small despite a high voltage difference between terminals 11 and 12. Accordingly, since the gate dielectrics of the two transistors need not be designed to withstand high voltage differences between the gate and source/shield, there may be a consequent relaxation of their design requirements. In particular, the dielectrics may be thinner, resulting in lower gate threshold voltages.

Advantageously to minimize latch-up problems, each of the thyristors is designed in known fashion to require a holding current for keeping it in an ON condition, after it is toggled into such condition, which is higher than the current available to it during normal operation. Accordingly, after any abnormal current surges end and normal current flows, the thyristor returns to the OFF state.

Alternatively in some applications, it may be desirable to continue to keep the appropriate thyristor in the ON state so long as the transistors conduct to minimize the series resistance of the switch. In this case, the turn-on current and holding current requirements would be modified appropriately and provision may need to be made to ensure turn-off of the thyristors when the transistors are turned off and the switch is intended to be open.

In the conduction mode of each thyristor, the shunt resistance between the P-type anode and the N-type gate advantageously is kept at a low value by the heavily doped N-type skin layer 234 and by the conducting channel of the DMOS transistor between the gate and anode terminals. Similarly, the shunt resistance which shorts the P-type shield layer to the N-type source region is made small by including the low resistivity P-type central portion in the shield layer where it is contacted by the source electrode.

Because of these shunting resistors, the starting current of the thyristor advantageously can be designed to be rather high, thus ensuring a wide range for the linear MOS operation mode of the solid-state relay before the thyristors start to shunt any current.

In this respect, our solid-state relay differs markedly from the thyristor structures described in the aforementioned Tihanyi paper which are not designed for operation in a linear range as transistors.

These properties which make for a high starting current will also make for a high holding current, as desired, to ensure that the thyristors will be turned off once the current surges have passed and normal current flows. Similarly, these properties make the solid-state relay relatively insensitive to high voltage, high dV/dt transients that are known to switch conventional thyristors from an OFF to ON state.

It is also advantageous in the design that the maximum voltage that the relay can successfully block in the OFF state be primarily determined by the resistivity of the bulk and the spacing between the shield regions 236 and 241. This consideration also requires that the regions 236 and 241 be adequately spaced from the low resistivity region 234.

In the event that the voltage applied to the relay in its OFF state exceeds its maximum blocking voltage, the avalanche multiplication which thereby occurs triggers the thyristor to its low resistance ON state so as to prevent excessive power dissipation and consequent damage to the device. When the over-voltage surge has ceased, the current through the thyristor drops below the holding current and the relay returns to its OFF state.

There are several concepts that the design of a solid-state relay of the kind described can advantageously include. In particular, to maximize the lateral conduction, the transistor geometries should favor large current-carrying channel widths. Similarly, to maximize the vertical conduction, in addition to the heavily doped skin layer, there should be fairly complete coverage of the tub surface in a manner to permit wide linear operation consistent with vertical conduction through the chip.

It is to be noted that in the solid-state relay 224 shown in FIG. 3 the right-most portion of the left transistor and the left-most portion of the right transistor together provide substantially all of the thyristor trigger action. This suggests that each of the two transistors may be divided into two parallel portions without affecting the thyristor mode of operation, of which the left portion of the left transistor and the right portion of the right transistor would be designed primarily to provide maximum vertical currents in the transistor mode to improve the transistor mode of operation. This division can be done readily in the embodiment of FIG. 3 if regions 235 and 240 and the gate electrodes are not completely annular but separate segments, as mentioned above. Embodiments of this kind are described below.

There will be many applications for switches in which protection against overvoltage and current surges needs to be provided for only a single polarity, as for example when terminal 11 of FIG. 1 will always be the more positive terminal, in which case thyristor 17 is superfluous in the switch shown in FIG. 1, and thyristor 117 in the switch shown in FIG. 2.

Figure 4:
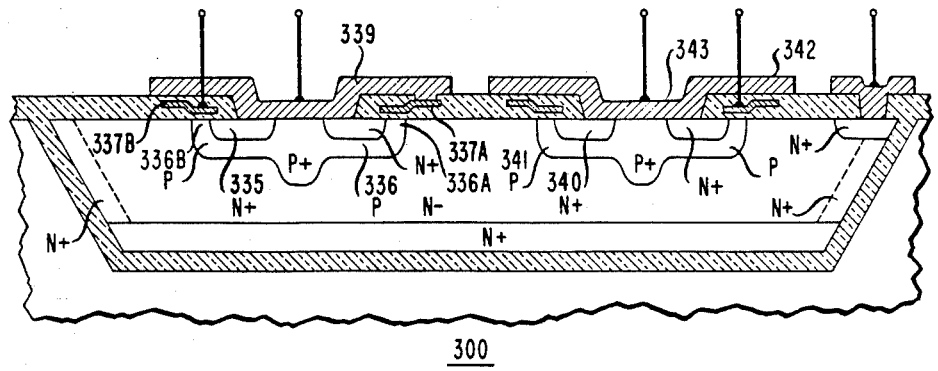

In this instance, the basic relay shown in FIG. 3 may be modified to the form shown in FIG. 4. In this embodiment, the right-most transistor keeps the same form it had in FIG. 3. However, the left transistor is modified for the segmentation of the gate electrode into two sections, one 337A overlying the right-most channel surface portion 336A of the shielding region 336 and so close to the right transistor, which primarily participates in the thyristor action and the other 337B, overlying the left-most channel surface portion 336B of the shielding region 336 and so remote from the right transistor, which little participates in the thyristor action. Electrode 337A is connected to source/shield electrode 339 whereby it is always maintained at the same potential of the source region 335, thereby ensuring that the underlying region of the shielding region is never inverted in operation and so is inactive to form a channel to participate in the DMOS conduction process. The elimination of this channel facilitates turn-on of the thyristor portion of the device and facilitates the injection of holes from that portion of shielding region 336 which is closest to source region 340, which serves as the cathode of the thyristor, effectively shortening the path the holes need to take and thereby increasing the number of holes reaching the cathode region because of the reduced likelihood of recombination. Also prevented is the formation of a potential barrier in the vicinity of the right-most portion 336A of the shielding region 336 which would otherwise inhibit transport to the cathode of thyristor 16 (region 340) of the holes injected from the anode of the thyristor. Gate electrode 337B is operated in the manner described in FIG. 1 for gate electrodes.

Figure 5:
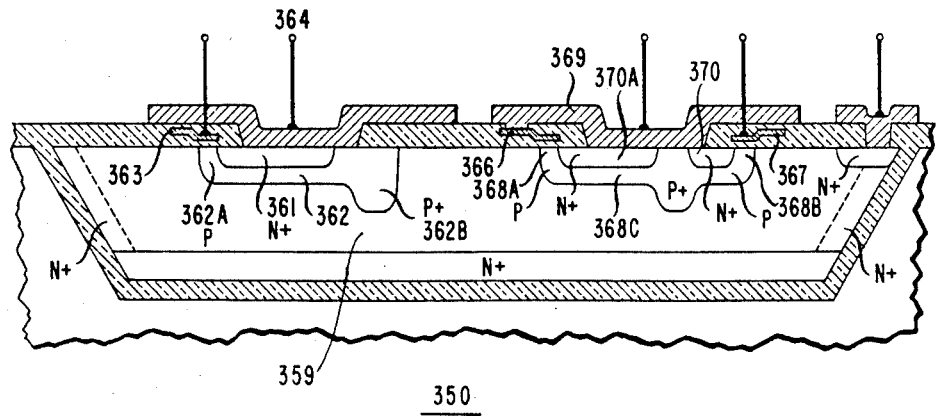

However, it can be appreciated that since this right-hand portion of the left transistor has been made inactive for amplification purposes, it serves little purpose and can be eliminated. In FIG. 5 there is shown such an embodiment 350.

In this embodiment, the left-most transistor has been truncated as suggested above and now comprises a localized N-type region 361 surrounded by the shield region 362 which includes a left-most localized surface portion 362A, which is lightly doped and adapted to be inverted to form a channel region, and the more heavily doped remainder 362B. A gate electrode 363 overlies the surface portion 362A and is operated in the manner discussed for gate electrodes in the earlier embodiments. Source/shield electrode 364 makes low resistance connection to regions 361 and 362B.

The right-most transistor can take either of two forms. Firstly, though not shown, it can take the same form it had in the relay shown in FIGS. 3 and 4 in which it includes an annular gate electrode which is maintained separate from the source/shield electrode whereby it acts to invert selectively the underlying channel portion of the shield region. However, better efficiency and easier control of the thyristor parameters can be obtained if there is substituted the structure shown in FIG. 5.

In this structure separate gate electrodes 366,367 are provided to overlie the left and right channel surface portions 368A and 368B, respectively, of the shielding layer 368. Gate electrode 366 is then connected directly to source/shield electrode 369 whereby the underlying portion 368A of P-type shielding layer 368 is prevented from being inverted.

As a result, very few electrons flow in this region. The hole current flows primarily into the more resistive portion of the shielding layer underlying the source region. Gate electrode 367 overlying portion 368B is operated in the manner of the gate electrodes in the earlier embodiments.

The embodiment depicted has a number of advantages. The thyristor is space efficient since it effectively moves the cathode and anode closer by the elimination of extraneous regions. The elimination of the channel regions reduces the impedance of the current path and removes a potential barrier to permit more efficient flow from anode to cathode and removes a sink for hole current, with a consequent reduction in the holding current of the thyristor.

Moreover, control of the level of current which will trigger thyristor action can be achieved by adjustment of the length of the portion 368C of the shielding layer which underlies the left portion 370A of the annular source 370.

In practice, we have found it particularly advantageous to employ the embodiment depicted in FIG. 5 for unilateral thyristor protection and when bilateral thyristor protection is desired to include a separate thyristor section of the same kind, oppositely poled, in parallel (i.e., the right and left portions reversed), as will be discussed more fully hereinafter.

For applications where large currents are to be switched, it is advantageous to include in a single tub a parallel arrangement of transistors in the manner used in power MOSFETs to handle such currents efficiently. Any of the known parallel arrangements can be employed. A particular arrangement found efficient is one in which each of the two separate DMOS transistors shown in FIGS. 1 and 2 is achieved by a regular two-dimensional array of separate sources and shield regions operated in parallel and sharing a common drain region. In FIG. 6 there is shown one line 470 of such a rectangular array for the two DMOS transistors. The rectangular array would be built up by similar lines extending parallel to the one shown in planes parallel to the plane of the drawing, so that a top view, not shown, would show a two-dimensional rectangular matrix of sources and surrounding shield regions. This line includes only a single thyristor to provide protection only in a single direction as discussed in connection with FIGS. 4 and 5. If only single direction protection is desired, all the lines would have this same orientation. However, if bilateral protection is desired, advantageously successive lines in the direction normal to the plane of the drawing would have their left-right orientation reversed so that there would be formed, between the two subsets of DMOS transistors, a linear row extending normal to the plane of the drawing. In this linear row of thyristors, contiguous ones would be oppositely poled. This will become more apparent as the description of this embodiment progresses.

In such a relay portion, the various elements may be considered as forming a left and a right subset of DMOS transistors sharing a common drain. The left subset comprises in parallel a plurality of vertical DMOS transistors 471, with sources and shielding regions of the kind included in the embodiment of FIG. 3, with adjacent channel portions sharing segmented gate Celectrode portions 479. At the right edge of the left subset there is included a transistor 472 of the kind shown as the left transistor of the embodiment of FIG. 5. The right subset comprises in parallel a plurality of vertical DMOS transistors 473 of the kind in the left subset sharing segment gate electrode portions 481, and further including at its left edge a transistor 474 of the kind shown as the right transistor in the embodiment of FIG. 5. Portions of transistors 472 and 474 cooperate to form a unilateral thyristor of the kind described in connection with FIG. 5. The remaining majority of transistors serve as transistors for operation in the linear region before the onset of thyristor action.

As seen in the drawing, the source/shield regions of each of the transistors of the left subset share a common electrode 475 which is connected to lead 476, which would be connected to main terminal 11 of the switch as shown in FIG. 1. The source/shield regions of each of the transistors of the right subset share a common electrode 477 connected to lead 478, which would be connected to the other main terminal 12 of the switch.

The gate electrodes 479 of each transistor of the left subset are all interconnected to a common lead 480 and the gate electrodes 481 of each transistor of the right subset except the left-most are all interconnected to a common lead 482. The gate electrode of the left-most transistor of the right subset is connected instead of the electrode 477, which is connected to lead 478, as discussed in connection with FIG. 5. Finally, if desired, a connection, not shown, is made to the N-type bulk of the body corresponding to the node 15 in the switch of FIG. 1.

As discussed in connection with FIG. 5, the turn-on current of the thyristor can be controlled by the length of the resistive portion of the shielding layer underlying its cathode, the N-type source of transistor 474. Thus, its length is shown longer than the sources of the other transistors.

As alluded to above, if bidirectional protection is desired, there is merely alternated the polarity of the thyristor in adjacent lines of the two-dimensional array so that successive lines include oppositely poled thyristors. Alternatively, instead of alternating successive lines, the lines of the same polarity of the thyristor could be grouped together to form two groups of different polarity.

The partial unmerging possible in embodiments of this kind permits the majority of the transistors to be designed with primary emphasis on the conduction of current efficiently, including the close spacing, of such transistors since only the spacing between the innermost transistor of each subset needs be sufficient to withstand the high voltages the switch is intended to withstand. This makes possible the realization of higher currents per unit area of tub surface and the achievement of low series resistance for the switch, particularly since the presence of the N+ type skin layer facilitates the lateral flow between the two subsets.

It should be apparent that other geometries should be feasible. For example, instead of the alternation of contiguous rows for bilateral protection, there can be two subsets, each comprising a plurality of contiguous rows of like polarity, with the two subsets of opposite polarity.

Moreover, there can be devised arrangements in which the equivalent of right and left subsets of the DMOS transistors can be achieved by the interleaving rows of DMOS transistors corresponding to the two subsets, and positioning the thyristors at ends of the rows.

Finally, it can be appreciated that if only unilateral protection is desired, the thyristors may all be poled in the one appropriate direction.

It should be evident that in addition to paralleling a number of elements in a common tub while sharing common auxiliary circuitry for increased current handling ability it should also be feasible to parallel a numbe of solid-state relays of the kind described in separate tubs.

It will, of course, be apparent that there can be used auxiliary circuits in which the control portion employs external electrical signals directly rather than photovoltaic voltages.

FIG. 7 shows a switch 200 which can employ any of the forms of solid-state relays previously described and which is adapted to be switched by TTL level electrical signals rather than by optical pulses. The switching signal is supplied to input control terminal 291 and after passing through resistor 292 is applied to the base of the level shifting NPN bipolar transistor 293 whose emitter is grounded and whose base is also connected to ground by way of the diode 294.

The collector of transistor 293 is connected to the base of PNP bipolar transistor 295 whose emitter is tied to the source of most positive potential in the circuit V++ and by way of diode 296 to its base. The collector of transistor 295 is connected to control node 297. The transistor 295 acts as a current mirror and provides a signal current which is the image of the signal current of transistor 293 appropriately shifted in voltage level. Control node 297 is connected by way of blocking diode 298 and resistor 299 to one main terminal 211 and by way of blocking diode 201 and resistor 202 to the other main terminal 212. The node between diode 298 and resistor 299 is connected to one gate electrode lead 213 of the solid-state relay 290, which can be of a kind previously described, and the node between diode 201 and resistor 202 is connected to the other gate electrode lead 214. Zener diodes 204 and 205 are connected across resistors 299 and 202, respectively, to clamp the source-gate bias of each of the DMOS transistors so as to protect the gates from overvoltage damage, as did zener diodes 128 and 129 in the switch of FIG. 2.

Positive signals applied to terminal 291 are transmitted to control node 297 effective in switching the resistance between terminals 211 and 212 from a high to a low state.

It can be appreciated that this circuit basically resembles that shown in FIG. 1 with the principal difference being in the manner in which the switching signal is established on the control node. Accordingly, parts of this circuit too can be modified in the manner described in connection with FIG. 2. In particular, each of resistors 299 and 202 can be advantageously replaced by a voltage variable resistor, such as a JFET, with the appropriate addition of a series resistor for controlling the gate voltage as shown in FIG. 2.

From the foregoing it should be apparent that a variety of control circuits can be used successfully with the solid-state relay to achieve a desired form of switch.

It should also be apparent that the polarities of the various zones of the relay might be reversed to incorporate P-channel DMOS transistors and to adopt the relay to switching by negative pulses applied to the gates.

Moreover, it should be appreciated that although DMOS transistors historically involved a simultaneous double-diffusion process for making the source and drain regions, other fabrication techniques, such as ion implantation, and other device types, such as that described as VMOS, may be employed to form the generic form as the term has been used herein.

What is claimed is:

1. A semiconductive switching device comprising a semiconductive body (350) including a bulk portion (359) of one conductivity type and within said bulk first (361) and second (370) spaced apart surface source regions of the one conductivity type, first (362) and second (368) spaced shielding regions of the opposite conductivity type enclosing the first and second source regions, respectively, a first electrode (364) making a direct electrical connection to both the first source and first shielding regions, a second electrode (369) making a direct electrical connection to both the second source and second shielding regions, a third electrode (363) overlying and insulated from a surface portion (362A) of the first shielding region remote from the second shielding region for serving as a gate electrode for selectivity inverting said portion of the shielding region and forming a channel therein, a fourth electrode (367) overlying and insulated from a surface portion (368B) of the second shielding region more remote from the first shielding region for serving as a gate electrode for selectively inverting said portion of the second shielding region for forming a channel therein, a fifth electrode (366) overlying and insulated from a surface portion (368A) of the second shielding region more adjacent the first shielding region and making a direct electrical connection to the second electrode (369), and a connecting region located contiguous with the bulk portion and having a conductance which is sufficient for supplying a relatively low resistance path for charge carriers flowing between the first and second surface source regions via respective portions of the first and second spaced shielding regions underlying the third and fourth electrodes, respectively.

2. A device in accordance with claim 1 in which the first source region, the portion of the first shielding region remote from the second source region, the bulk and the third electrode cooperate to form a first MOS transistor, the second source region, the portion of second shielding region remote from the first source region, the bulk and the fourth electrode cooperate to form a second MOS transistor, and the first shielding region, the bulk, the second shielding region, and the second source region cooperate to form a thyristor, and the connecting region is in the form of a skin layer of the one conductivity type located contiguous with an opposing surface of the bulk portion, said opposing surface being situated on an opposite side of the bulk portion from the surface source regions.

3. A device according to claim 2 in which the first and second electrodes are connected to first and second terminals of the device in series with which is to be connected the load to be switched, and the third and fourth electrodes are connected to separate third and fourth terminals, respectively, of the device.

4. A device in accordance with claim 3 which further includes an electrode connection to the bulk portion which is connected to a fifth terminal.

5. A device in accordance with claim 4 in combination with a control circuit which includes means forming a control node, photovoltaic means between said control node and said fifth terminal, means including voltage-controlled variable resistor means, resistor means and diode means serially connected between said first terminal and the control node, means including voltage-controlled variable resistor means, resistor means, and diode means serially connected between said second terminal and the control node, and means connecting the third terminal to the node between the first-mentioned variable resistor means and resistor means, and means connecting the fourth terminal to the node between the second-mentioned variable resistor means and resistor means.

6. The combination of claim 5 in which the control circuit further includes separate clamping means between the first and third terminals and between the second and fourth terminals.

7. The combination of claim 6 in which each of the variable resistor means is a junction field-effect transistor whose channel is in the series path and whose gate is connected to the node between the resistor means and the diode means in the path.

8. The combination of claim 7 which includes a tap in the photovoltaic means to derive a fraction of the total photovoltaic voltage and the tap is connected by way of separate diode means to the node between the first junction field-effect transistor and its serially connected resistor means and to the node between the second junction field-effect transistor and its serially connected resistor means.

9. A semiconductive device comprising a semiconductive body including a bulk portion of one conductivity type and including, within said bulk portion, first and second spaced surface source regions of the one conductivity type, first and second shielding regions of the opposite conductivity type enclosing the first and second source regions, respectively, a first electrode making a direct electrical connection to the first source and first shielding regions, a second electrode making a direct electrical connection to the second source and second shielding regions, a third electrode overlying only a limited surface portion of the first shielding region relatively more remote from the second shielding region and dielectrically spaced therefrom for serving as a gate electrode for selectively inverting said portion of the shielding region and forming a channel therein, and a fourth electrode overlying essentially all of the surface portion of the second shielding region for selectively inverting said surface portion of the shielding region and forming a channel therein.

10. A device in accordance with claim 9 in which the first source region, the portion of the first shielding region underlying the third electrode, the bulk and the third electrode cooperate to form a vertical MOS transistor, the second source region, the second shielding region, the bulk and the fourth electrode cooperate to form a second vertical MOS transistor, and the portion of the first shielding region relatively close to the second source region, the bulk, the second shielding region, and the second source region cooperate to form a lateral thyristor.

11. A switch including
a solid-state relay including at least four terminals including first and second main terminals and third and fourth control terminals, a pair of MOS transistors having their channels in series connected between the first and second terminals, and the gate electrodes of the two transistors connected separately to the third and fourth terminals, respectively, and a parallel pair of thyristors, oppositely poled, connected between the first and second terminals, and having their gates connected to a node between the two MOS transistors; and
a control circuit connected to the terminals of the relay comprising a control node, means forming a conductive path from the first terminal to the control node including a first voltage-controlled variable resistor and a first diode, and means forming a conductive path from the second terminal to the control node including a second voltage-controlled variable resistor and a diode means, a first zener diode connected between said first and third terminals, a second zener diode connected between said second and fourth terminals, means forming a conductive path between the third terminal of the relay and a node between the first voltage-controlled variable resistor and the first diode, and means forming a conductive path between the fourth terminal and a node between the second voltage-controlled variable resistor and the second diode, and means for developing a switching voltage to the control node of the control circuit.

12. A switch in accordance with claim 11 in which the switching voltage is developed by a photovoltaic means connected between the control node and a terminal connected to the node between the two series MOS transistors.

13. A switch in accordance with claim 12 in which each of the voltage-controlled variable resistors is separate junction field-effect transistor whose gate is connected in the associated conductive path.

14. A switch (110) which includes a solid-state relay (124) which has first (111) and second (112) main terminals between which extend both a parallel pair of oppositely poled thyristors (116,117) and a series pair of DMOS transistors (113,114) with the first terminal connected to the source of the first transistor and the second terminal connected to the source of the second transistor, third (133) and fourth (134) control terminals connected to the gates of the first and second DMOS transistors, respectively, and a fifth terminal (135) connected to the node (115) shared by the drains of the two DMOS transistors and the anode-gates of the two thyristors, and a control circuit comprising means forming a path between said first terminal and a control node (119) including first resistive means (140) and a first diode (120), the third terminal being connected to a point in the path between the first resistive means and the first diode, means forming a path between said second terminal and the control node including second resistive means (141) and a second diode (122), the fourth terminal being connected to a point in said last-mentioned path between said second resistive means and the second diode, a third diode (128) between said first and third terminals, a fourth diode (129) between said second and fourth terminals, and photovoltaic means (118) actuatable for creating a switching voltage connected between the fifth terminal and the control node.

15. A switch in accordance with claim 14 in which the first and second resistive means are voltage-controlled variable resistive means (140,141) and means (the connections to the gates of 140 and 141) are included for making the resistance of such means high when the photovoltaic means are energized.

16. A switch comprising a solid-state relay comprising a silicon body which includes a series pair of oppositely poled DMOS transistors (113,114), and a pair of oppositely poled thyristors (116,117), each in parallel with the series pair of DMOS transistors, the drains of the transistors and the anode-gates of the thyristors sharing a common region of the body, a first terminal (111) connected to the source of the first transistor, the anode of the first thyristor and the cathode of the second thyristor, a second terminal (112) connected to the source of the second transistor, the cathode of the first thyristor and the anode of the second thyristor, a third terminal (133) connected to the gate of the first transistor, a fourth terminal (134) connected to the gate of the second transistor and a fifth terminal (135) connected to said common region of the body,
a control circuit connected to the solid-state relay including photovoltaic means (118) connected between the fifth terminal and a control node, means forming a conductive path between said first terminal and the control node including in series the channel of a first junction field-effect transistor (140), a first resistor (142) and a first diode (120), the gate of the first field-effect transistor being connected to the node between the first resistor and the first diode, means forming a conductive path between said second terminal and the control node including in series the channel of a second junction field-effect transistor (141), a second resistor (143), and a second diode (122), the gate of said second junction field-effect transistor being connected to the node between said second resistor and second diode, the node between the first JFET and the first resistor being connected to the third terminal, the node between the second JFET and the second resistor being connected to the fourth terminal, and a third diode (128) connected between the first and third terminals, and a fourth diode (129) connected between the second and fourth terminals.

17. A switch in accordance with claim 16 in which the photovoltaic means includes a node of intermediate voltage and such node is connected to the third and fourth terminals by way of separate fifth and sixth diodes (146,147), respectively.

18. In combination, a solid-state relay having first, second, third, and fourth terminals and an internal node in which a pair of DMOS transistors, which share a common drain, have their channels serially connected between the first and second terminals, and the common drain constitutes the internal node, the gates of the two transistors being connected to the third and fourth terminals, respectively, and a parallel pair of thyristors oppositely poled are connected between said first and second terminals, the anode-gate of each being connected to the common node, and a control circuit connected between the terminals of the solid-state relay comprising a control node, means forming a conduction path between the first terminal and the control node including first voltage-controlled variable resistance means, first resistor and a first diode, means forming a conduction path between said second terminal and the control node include a second voltage-controlled variable resistance means, a second resistor and a second diode, the third terminal being connected to the node between the first voltage-controlled variable resistive means and the first resistor, the fourth terminal being connected to the node between the second voltage-controlled variable resistive means and the second resistor, separate means for clamping the voltage between the first and third terminals and between the second and fourth terminals, and means for varying the potential of the control node in accordance with the switching signals.

19. The combination of claim 18 in which the means for varying the control node comprises current mirror means supplied with the switching signals for voltage level shifting of the switching signal.

20. A solid-state relay comprising a semiconductive body in which there are formed first and second subsets of MOS transistors and at least one set of thyristors, each transistor of both subsets including a surface source region of one conductivity type, a drain region of the one conductivity type and intermediate the source and drain regions a shielding region of the opposite conductivity type surrounding the source region and including a surface portion designed to be inverted in operation for forming a channel between the source and drain regions, the drain regions of all the transistors being merged in the bulk region of the body, a first subset of source/shield electrode means for making direct electrical connection both to each source and shielding regions of the first subset of MOS transistors, a second subset of source/shield electrode means for making direct electrical connection both to each source and shielding regions of the second subset of MOS transistors, a first subset of gate electrode means overlying and insulatingly spaced from the surface portion regions to be inverted for forming channels of the first subset of MOS transistors, a second separate subset of gate electrode means overlying and insulatingly spaced from the surface portion regions to be inverted for forming channels of the second subset of MOS transistors, each thyristor comprising a first cathode surface region of the one conductivity type, a second enclosing region of the opposite conductivity type surrounding the cathode region, a third anode-gate region of the one conductivity type enclosing the second region, and a fourth anode region of the opposite conductivity type enclosed within the third region, the second region including a first surface portion relatively remote from the anode region adapted to be inverted for forming a channel between said first and third regions and a second surface portion relatively close to the anode region adapted to remain uninverted, the anode-gate regions of all the thyristors being merged with one another and with the drain regions of all the transistors in the bulk region of the body, cathode electrode means making direct electrical connection to the cathode and second regions of each thyristor and the source/shield electrode means of the first subset of transistors, gate electrode means overlying and dielectrically spaced from each first surface portion of the second region for inverting said surface portion and forming the channel between the cathode and anode-gate region, said gate electrode means being directly connected to gate electrode means of the first subset of transistors, and anode electrode means making direct connection to the fourth anode regions of all the thyristors and the source/shield electrode means of the second subset of transistors.

21. A solid-state relay in accordance with claim 20 in which the semiconductive body further includes a second set of thyristors of the kind recited whose cathode electrode means are connected to the source/shield electrode means of the second subset of transistors, whose gate electrode means are connected to the gate electrode means of the second subset of transistors, and whose anode electrode means are connected to the source/shield electrode means of the first subset of transistors.

22. A semiconductive device comprising a semiconductive body whose bulk is of one conductivity type and of relatively high resistivity and which is substantially enclosed within a layer of relatively lower resistivity of the same conductivity type, the body comprising a right portion and a left portion, each portion including a two-dimensional array of DMOS transistors, each such transistor comprising a source region of the one conductivity type surrounded by an enclosing shield region of the opposite conductivity type, a source/shield electrode making direct electrical connection to the source and shield regions, a gate electrode overlying the channel formed between the source region and the high resistivity bulk portion and electrically insulated from the body, and a drain region formed by the bulk, with the source/shield electrodes of the right portion all being electrically connected to a first terminal, and the source/shield electrodes of the left portion all being electrically connected to a second terminal, the gate electrodes of the right portion all being electrically connected to a third terminal, and the gate electrodes of the left portion all being electrically connected to a fourth terminal, and intermediate between the two arrays of DMOS transistors, only a row of single thyristors with successive thyristors in the row being oppositely poled, each thyristor extending laterally between a different pair of transistors consisting of a leftmost transistor of the right portion array and a rightmost transistor of the left portion array and comprising in one of the two portions of the body, a first region of the one conductivity type, a second region of the opposite conductivity type surrounding the first region, and in the other portion of the body a third region of the one conductivity type, and a fourth region of the opposite conductivity type surrounding said third region, the second and fourth regions being surrounded by the bulk of the one conductivity type, a first electrode making direct electrical connection to the first and second regions and to the source/shield electrode associated with the array of DMOS transistors in its corresponding portion of the body, a second electrode electrically insulated from the body, overlying the channel portion of the second region more remote from the fourth region, and making a direct electrical connection to the gate electrode associated with its corresponding portion of the body, a third electrode making direct electrical connection to the third and fourth regions, a fourth electrode making direct electrical connection to the third electrode and overlying the channel portion of the fourth region between the third region and the bulk, proximate the second region and insulated from the body, the third and fourth electrodes making direct electrical connection to the source/shield electrode associated with the array of DMOS transistors in its corresponding portion of the body, and a fifth electrode overlying the channel region of the fourth region between the third region and the bulk more remote from the second region, the fifth electrode making direct electrical connection to the gate electrodes of its corresponding portion of the body.

23. In combination, the semiconductive device of claim 22 in combination with a control circuit including a control node, means forming a conductive path between said control node and the source/shield electrode making electrical connections to the source/shield regions of the first subset of transistors, including a first junction field-effect transistor, a first resistor and a first diode, means forming a conductive path between said control node and the electrode making electrical connection to the source/shield regions of the second subset of transistors including a second junction field-effect, a second resistor, and a second diode, a first zener diode connected between the source/shield electrodes and the gate electrodes of the first subset of MOS transistors, a second zener diode connected between the source/shield electrodes and the gate electrodes of the second subset, and photovoltaic means connected between the control node and the bulk region of the semiconductive device.

* * * * *